United States Patent
Hou et al.

(10) Patent No.: US 11,988,575 B2
(45) Date of Patent: May 21, 2024

(54) RETICLE DEFECT INSPECTION METHOD AND SYSTEM

(71) Applicant: CHANGXIN MEMORY TECHNOLOGIES, INC., Hefei (CN)

(72) Inventors: Lihua Hou, Hefei (CN); Wen-Hao Hsu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 435 days.

(21) Appl. No.: 17/460,404

(22) Filed: Aug. 30, 2021

(65) Prior Publication Data

US 2022/0026307 A1 Jan. 27, 2022

Related U.S. Application Data

(63) Continuation of application No. PCT/CN2021/100235, filed on Jun. 16, 2021.

(30) Foreign Application Priority Data

Jul. 23, 2020 (CN) .......................... 202010717492.1

(51) Int. Cl.
*G01M 11/02* (2006.01)
*G03F 7/00* (2006.01)

(52) U.S. Cl.
CPC ..... *G01M 11/0278* (2013.01); *G03F 7/70591* (2013.01)

(58) Field of Classification Search
None
See application file for complete search history.

(56) References Cited

U.S. PATENT DOCUMENTS

| 5,445,029 A | 8/1995 | Falsetti |
| 5,618,994 A | 4/1997 | Falsetti |
| 2004/0062432 A1 | 4/2004 | Ishikawa |
| 2008/0126014 A1 | 5/2008 | Cui |

(Continued)

FOREIGN PATENT DOCUMENTS

| CN | 102486604 A | 6/2012 |
| CN | 103887203 A | 6/2014 |
| CN | 105957061 A | 9/2016 |

(Continued)

OTHER PUBLICATIONS

English machine translation of Zhang et al. (CN 108227371 A) (Year: 2018).*

(Continued)

*Primary Examiner* — Walter L Lindsay, Jr.
*Assistant Examiner* — Geoffrey T Evans
(74) *Attorney, Agent, or Firm* — Cooper Legal Group, LLC

(57) ABSTRACT

Provided are a reticle defect inspection method and system. The reticle defect inspection method includes: a reticle is provided; a reticle defect inspection system is provided, and when the reticle is placed on a station or leaves the station, defect inspection is continuously performed on the reticle to obtain defect information of each defect; a dynamic threshold of each defect is obtained from the defect information of each defect; and whether the dynamic threshold of each defect belongs to a threshold unacceptable by the inspection system is judged, and if so, warning processing is performed.

16 Claims, 1 Drawing Sheet

(56) References Cited

U.S. PATENT DOCUMENTS

2020/0033122 A1 1/2020 Toyoda et al.

FOREIGN PATENT DOCUMENTS

| | | |
|---|---|---|
| CN | 106933062 A | 7/2017 |
| CN | 108227371 A | 6/2018 |
| CN | 106933062 B | 3/2019 |
| CN | 110782045 A | 2/2020 |
| CN | 110995477 A | 4/2020 |
| TW | 201814244 A | 4/2018 |
| WO | 2018061480 A1 | 4/2018 |

OTHER PUBLICATIONS

English machine translation of Toyoda et al. (WO 2018061480 A1) (Year: 2018).*
International Search Report in the international application No. PCT/CN2021/100235, mailed on Sep. 15, 2021, 8 pgs.
First Office Action of the Chinese application No. 202010717492.1, issued on Jul. 1, 2022, 12 pgs.

* cited by examiner

RETICLE DEFECT INSPECTION METHOD AND SYSTEM

CROSS-REFERENCE TO RELATED APPLICATIONS

This is continuation of international application PCT/CN2021/100235, filed on Jun. 16, 2021, which claims priority to Chinese application No. 202010717492.1, filed on Jul. 23, 2020 and entitled "RETICLE DEFECT INSPECTION METHOD AND SYSTEM". The contents of international application PCT/CN2021/100235 and Chinese application No. 202010717492.1 are hereby incorporated by reference in their entireties.

TECHNICAL FIELD

The disclosure relates to a reticle defect inspection method and system.

BACKGROUND

In a manufacturing process of a semiconductor device such as Dynamic Random Access Memory (DRAM), photolithography is a critical step. In the photolithography process, a reticle plays a very important role, and the quality of the reticle directly influences the yield of semiconductor products, so that the inspection of the quality of the reticle becomes a necessary working procedure.

SUMMARY

According to a plurality of embodiments, a first aspect of the present application provides a reticle defect inspection method, including the following operations.

A reticle is provided.

A reticle defect inspection system is provided, and when the reticle is placed on a station or leaves the station, defect inspection is continuously performed on the reticle to obtain defect information of each defect.

A dynamic threshold of each defect is obtained from the defect information of each defect.

Whether the dynamic threshold of each defect belongs to a threshold unacceptable by the inspection system is judged, and if so, warning processing is performed.

According to a plurality of embodiments, a second aspect of the present application provides a reticle defect inspection system, including an obtaining module, a data processing module, and a warning module.

The obtaining module is configured to, when the reticle is placed on a station or leaves the station, continuously perform defect inspection on the reticle to obtain defect information of each defect.

The data processing module is electrically connected with the obtaining module and is configured to obtain a dynamic threshold of each defect from the defect information of each defect.

The warning module is electrically connected with the data processing module and is configured to judge whether the dynamic threshold of each defect belongs to a threshold unacceptable by the inspection system, and perform warning processing when judging that the dynamic threshold of the defect belongs to the threshold unacceptable by the inspection system.

The details of one or more embodiments of the present application are set forth in the accompanying drawings and description below. Other features and advantages of the present application will be apparent from the specification, drawings, and claims.

DETAILED DESCRIPTION

Since the reticle is continuously used before it is inspected that the reticle needs to be cleaned, particles or other defects on the surface of the reticle (the reticle defect mainly includes a fog-like defect, particle dust, a scratch, and the like) may continuously influence a manufacturing procedure during use, if it is subsequently found that dust particles or other defects exceeding the specification exist on the reticle, all wafers which have been subjected to the photolithography manufacturing procedure previously will be reprocessed, and this results in increased production cost. In order to avoid this phenomenon, it is important to establish an effective reticle defect inspection mode.

To facilitate the understanding of the present application, the present application will be described below in detail with reference to the accompanying drawings. Embodiments of the present application are given in the accompanying drawings. However, the present application may be embodied in many different forms and should not be limited to the embodiments set forth herein. Rather, these embodiments are provided so that the present application will be thorough and complete.

Unless defined otherwise, all technical and scientific terms used herein have the same meaning as commonly understood by those of ordinary skill in the art to which the present application belongs. The terms used herein in the specification of the present application are for the purpose of describing specific embodiments only and are not intended to limit the present application.

As used herein, the singular forms "a", "an", and "said/the" may include the plural forms as well, unless the context clearly indicates otherwise. It is also to be understood that the terms "comprise/include" or "have", or the like specify the presence of a stated feature, integer, step, operation, component, portion, or a combination thereof, but do not preclude the presence or addition of one or more other features, integers, steps, operations, components, portions, or combinations thereof. Meanwhile, in the specification, the term "and/or" includes any and all combinations of the associated listed items.

Figure 1:
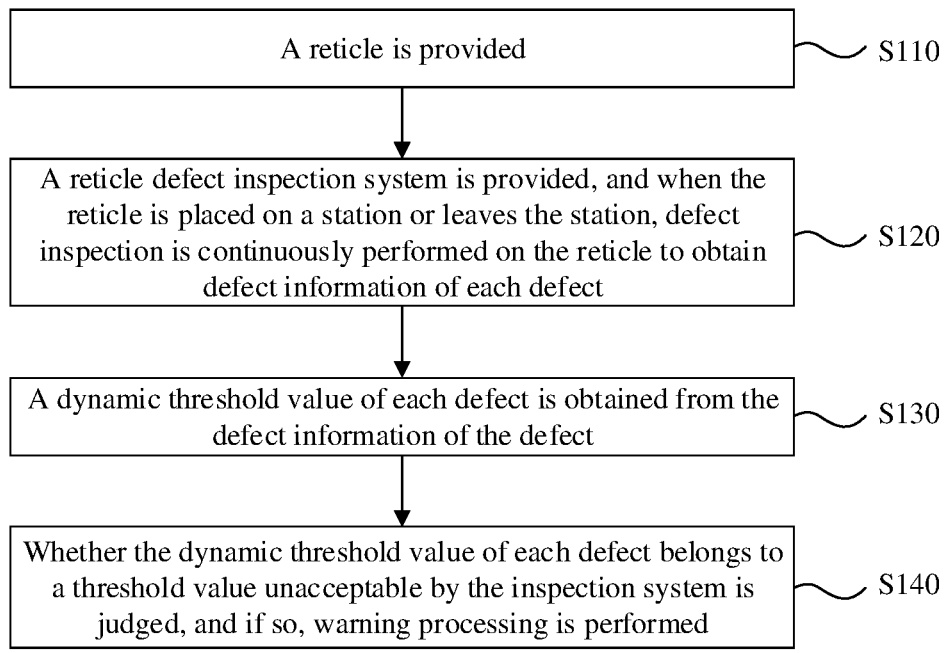
FIG. 1 is a flowchart of a reticle defect inspection method provided by an embodiment of the present application.

Referring to FIG. 1, the present application provides a reticle defect inspection method, mainly including the following steps.

S110, a reticle is provided.

S120, a reticle defect inspection system is provided, and when the reticle is placed on a station or leaves the station, defect inspection is continuously performed on the reticle to obtain defect information of each defect.

S130, a dynamic threshold of each defect is obtained from the defect information of the defect.

S140, whether the dynamic threshold of each defect belongs to a threshold unacceptable by the inspection system is judged, and if so, warning processing is performed.

It will be appreciated that a reticle defect generally includes the fog-like defect, the particle dust, the scratch, and the like, and is typically inspected by using an Intelligent Reticle Inspection Station (IRIS). It is common in the industry to calculate the size of a particle falling on the reticle with a fixed illuminance spot size and a relatively general exposure lighting condition, thereby obtaining a fixed particle size specification requirement to judge whether the product is influenced by the particle falling on the reticle or the defect.

At present, when reticle defect inspection is performed based on IRIS inspection data, for example, when inspection, analysis and early-warning are performed on the particle, if the particle size is 40 µm, NG is reported, and related personnel are informed to process the reticle. In a fixed particle size judgment mode, due to influence of an inspection error of an inspection device, when warning information indicating that the particle size exceeds the specification is generated, the specification of the previous particle may also have exceeded the specification, so that the analysis of the defect of which the particle size does not reach 40 µm is also important. In the present application, a measurement error is taken into consideration when reticle inspection is performed, the dynamic threshold of each defect is obtained according to the inspected defect information of each defect, whether the dynamic threshold of each defect belongs to the threshold unacceptable by the inspection system is judged, and the warning processing is performed when the dynamic threshold of each defect belongs to the threshold unacceptable by the inspection system. Early-warning is performed on the reticle defect in advance, so that the reticle is cleaned timely, and the reprocessing rate and the production cost are reduced.

In one embodiment, the following operations are further included.

Before inspection, a static threshold of the inspection system is set, and when the defect information of the defect reaches the static threshold, historical defect information of the defect is obtained.

A measurement error range of the defect is calculated according to the historical defect information of the defect.

A threshold unacceptable by a dynamic threshold inspection system of the defect is calculated according to the static threshold and the measurement error range.

In the embodiment, the static threshold is a conventional set parameter (for example, 40 µm) in an existing IRIS inspection system. It will be appreciated that due to an error existing in station measurement, an inspection size of some particles having the actual size greater than or equal to 40 µm may be smaller than 40 µm, and the inspection size may be 32 µm, 33 µm, or 37 µm, so that the warning cannot be performed accurately and timely. In the embodiment, the measurement error range of the defect is calculated according to the historical defect information of the defect of different reticles and then the static threshold is reasonably limited by the measurement error range to obtain the threshold unacceptable by the inspection system. The dynamic threshold of each defect is compared with the threshold unacceptable by the inspection system to realize the early-warning in advance.

In one embodiment, the measurement error range is ($V_{min}$, $V_{max}$), and a dynamic threshold range of each defect is ($V_t+V_{min}$, $V_t+V_{max}$), where Vmax is a mean absolute error maximum of the historical defect information of the defect reaching the static threshold, $V_{min}$ is a mean absolute error minimum of the historical defect information of the defect reaching the static threshold, and $V_t$ is the defect information of the defect.

It will be appreciated that the mean absolute error is a mean error calculated by taking an absolute value of a predicted error, and the mean absolute error may avoid the fact that the errors cancel each other out, so that the magnitude of an actual predicted error may be reflected more accurately. Furthermore, since the warning is performed when the defect information of the defect exceeds the static threshold, actual measurement data of the defect is small by default, and the dynamic threshold of the defect is the sum of the actual measurement data and an error range. Then, the dynamic threshold range of the defect is determined according to the mean absolute error minimum, the mean absolute error maximum and the defect information of the defect, the dynamic threshold range of the defect is compared with the threshold unacceptable by the inspection system. If the dynamic threshold range of the defect is intersected with the threshold unacceptable by the inspection system, that is, at least one piece of defect information in the dynamic threshold range of the defect belonging to the threshold unacceptable by the inspection system, the warning processing is performed, so that the early-warning is realized, and meanwhile, the incapability of performing accurate early-warning due to the measurement error is solved.

When whether the dynamic threshold of the defect belongs to the threshold unacceptable by the inspection system is judged, the threshold unacceptable by the inspection system may be the static threshold, for example, the set static threshold in the inspection system. The threshold unacceptable by the inspection system may also be the dynamic threshold, for example, the dynamic threshold range unacceptable by the inspection system, the range is obtained by limiting the static range by using the measurement error. The early-warning is realized by using the dynamic threshold range unacceptable by the inspection system and the dynamic threshold of the defect.

In one embodiment, the threshold unacceptable by the inspection system is the static threshold. In the embodiment, the static threshold of the inspection system set before inspection may be used as the threshold unacceptable by the inspection system, the dynamic threshold range of the defect is compared with the threshold unacceptable by the inspection system, and whether the dynamic threshold range of the defect is intersected with the threshold unacceptable by the inspection system is judged. If an intersection exists, the warning processing is performed. In addition, the static threshold set in the inspection system may be limited by using the measurement error, and a numerical value is selected from a limited range randomly or according to experience to serve as the threshold unacceptable by the inspection system. For example, the static threshold (assumed to be 40 µm) set in the inspection system is limited according to the measurement error to obtain the limited range (38, 39). If an operator, according to experience, considers that the selection of 38.5 µm can perform warning timely and is beneficial to reducing the number of cleaning the reticle, the threshold unacceptable by the inspection system may be set as 38.5 µm.

In one embodiment, the threshold unacceptable by the inspection system is the dynamic threshold in the range of ($V_{target}-V_{max}$, $V_{target}-V_{min}$), where $V_{target}$ is the static threshold.

In the embodiment, after the mean error of each defect is calculated according to the historical defect information of a plurality of defects, the mean absolute error minimum and the mean absolute error maximum are determined from a plurality of mean absolute errors, and the set static threshold is reasonably limited according to the mean absolute error minimum and the mean absolute error maximum. The measurement error is taken into consideration, so that the defect of which the actual size may be greater than the static threshold is accurately determined, thereby realizing early-warning and reducing the reprocessing rate. Furthermore, in some other embodiments, a critical range may also be ($V_{target}$−$kV_{max}$, $V_{target}$−$kV_{min}$), where k is a coefficient that may be set based on an actual inspection need and/or human experience, and a limiting range of the static threshold may be adjusted through adjustment of the value k.

In one embodiment, the defect information of the defect includes coordinate information and the size of the defect.

In the embodiment, the defects with the same coordinate information but deviated sizes in the historical defect information of the defect are determined first, and then the mean absolute error of the defects with the same coordinate information but deviated sizes is obtained by using a mean absolute error calculation formula.

The mean absolute error maximum and the mean absolute error minimum are determined based on the calculated mean absolute error to obtain the measurement error range.

The mean absolute error calculation formula is as follows:

$$V_{MAD} = \frac{|(x_1 - \bar{x})| + |(x_2 - \bar{x})| + \ldots + |(x_n - \bar{x})|}{Cnt}$$

where $V_{MAD}$ is the mean absolute error of the defect, $\bar{x}$ is the mean size of the defect, $x_1, x_2, \ldots, x_n$ are the inspected sizes of the defects, and Cnt is the number of the defects with the same coordinate information but deviated sizes.

It will be appreciated that the size of the defect and the coordinate information of the defect are obtained at the same time in an inspection procedure, so that in a subsequent procedure of obtaining the measurement error range according to the historical defect information of the defect, the inspected defect size corresponding to the same defect may be determined according to position information, then the mean absolute error value corresponding to the defect is calculated according to all size corresponding to the defect, and further the measurement error range is determined according to the mean absolute error value of each defect. Furthermore, in the embodiment, the mean absolute error value corresponding to the defect with the deviated defect size is calculated only according to the determination of all defects which are located in the same coordinate and have the deviated sizes in the historical defect information, so that the accuracy of the measurement error range may be improved, meanwhile, the calculation amount is reduced, and a judgment procedure is accelerated.

In one embodiment, the historical defect information of the defect is the defect information of the defect collected in a selected period of time.

It will be appreciated that some reticles may have relatively high using frequency, the data amount of the corresponding defect information thereof is relatively large; some reticles may have relatively low using frequency, and the data amount of the corresponding defect information thereof is relatively small. In the embodiment, in consideration of the data amount, when the defect information of the defect reaches the static threshold, the historical defect information of the defect is the defect information of the defect collected in 6 to 8 hours. For example, when the defect information for the defect is inspected to reach the static threshold, data is collected in the latest 6 to 8 hours. In addition, the duration may be reasonably adjusted according to the using frequency of the reticle, for example, if the using frequency of a certain reticle is extremely high, the defect information of the defect previously collected in continuous 4 to 5 hours may be used as the historical defect information of the defect. As another example, if the using frequency of a certain reticle is extremely low, the defect information of the defect previously collected in half a year or three months may be used as the historical defect information of the defect.

In one embodiment, the historical defect information of the defect is the data inspected when cleaning and/or maintenance processing are not performed.

It will be appreciated that the data platform stores all collected inspection data about the use of the reticle. The data is too bulky, so that a feature sampling method needs to be adopted, that is, analysis is performed based on the inspection data of an analysis reticle in a feature station in certain periods. Furthermore, in the embodiment, the data inspected when the cleaning and/or maintenance processing are not performed is adopted, at this time, the size of the defect is relatively large, thereby facilitating the reduction of inspection errors.

In one embodiment, the reticle inspection method further includes that: the defect information of each defect is sent to a data platform for storage.

It will be appreciated that the inspection data is all inspection data collected when all reticles are used, and the inspection data is too bulky to be stored locally. Therefore, the data is stored in the data platform, a requirement of the size of the storage space of the IRIS may be reduced, meanwhile, other apparatuses may subsequently conveniently obtain the historical defect information of the corresponding defect from the data platform, and unified management on the inspected data is realized.

In one embodiment, warning information is sent in the form of an e-mail, a short message or a warning management system notice, thereby realizing the warning. In the embodiment, the warning information may include a code of the reticle, the size of the defect reaching the static threshold, the station corresponding to the reticle, and the like. Therefore, the warning information is sent in the form of the e-mail, the short message or the warning management system notice, a worker at a monitoring platform may conveniently obtain the warning information and specific content contained in the warning information and remove a fault quickly.

In one embodiment, the reticle defect inspection method further includes that: when inspecting that the defect information of the defect reaches the static threshold, the worker is notified to perform the cleaning and/or maintenance processing on the reticle.

It will be appreciated that when inspecting that the defect information of the defect reaches the static threshold, it indicates that the size of the defect on the current reticle has influenced the quality of a pattern, the reticle cannot be used continuously to perform photolithography, and the reticle needs to be cleaned. At present, removal is generally performed in a blowing mode. In some embodiments, a cathode plate and an anode plate are respectively placed on an upper surface and a lower surface of the reticle and a certain voltage is applied between the cathode plate and the anode plate, so that a high voltage electric field is formed between the cathode plate and the anode plate. Since the cathode discharges, electronegative gas ions are caused to move towards the anode plate under the effect of the electric field, the ions in movement collide with particles on the surface of the reticle, so that the particles are is negatively charged. The charged particles moves towards the anode plate under the effect of electric field force, so that the particles are deposited on the anode plate, thereby completely removing the particles on the surface of the reticle.

In one embodiment, during performing a photolithography process, when an exposure condition is changed, a new static threshold is correspondingly set according to the changed exposure condition, and recalculation is performed to obtain a new threshold unacceptable by the inspection system.

It will be appreciated that the static threshold is data related to the exposure condition. Under different exposure conditions, allowable sizes of the defects are different, so that during performing the photolithography process, when the exposure condition is changed, the new static threshold needs to be correspondingly set according to the changed exposure condition and the recalculation is performed to obtain the new threshold unacceptable by the inspection system.

Figure 2:
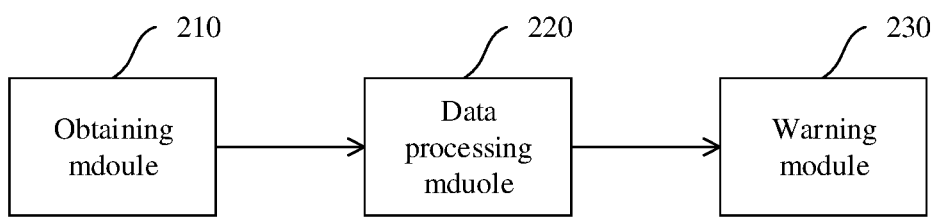
FIG. 2 is a schematic diagram of an electrical structure of a reticle defect inspection system provided by an embodiment of the present application.

Based on the same inventive concept, the embodiments of the present application further provide a reticle defect inspection system. Referring to FIG. 2, the reticle defect inspection system includes an obtaining module 210, a data processing module 220, and a warning module 230.

The obtaining module 210 is configured to, when the reticle is placed on a station or leaves the station, continuously perform defect inspection on the reticle to obtain defect information of each defect.

The data processing module 220 is electrically connected with the obtaining module 210 and is configured to obtain a dynamic threshold of each defect from the defect information of each defect.

The warning module 230 is electrically connected with the data processing module 220 and is configured to judge whether the dynamic threshold of each defect belongs to a threshold unacceptable by the inspection system, and perform warning processing when judging that the dynamic threshold of the defect belongs to the threshold unacceptable by the inspection system.

It will be appreciated that at present, when reticle defect inspection is performed based on IRIS inspection data, in a fixed particle size judgment mode (for example, if the particle size exceeds 40 μm, warning is performed), due to the influence of an inspection error of an inspection device, when warning information indicating that the particle size exceeds the specification is generated, the specification of the previous particle may also have exceeded the specification, so that the analysis of the defect of which the particle size does not reach 40 μm is also important. In the embodiment, a measurement error is taken into consideration when the reticle inspection is performed, the dynamic threshold of each defect is obtained according to the inspected defect information of each defect, whether the dynamic threshold of each defect belongs to the threshold unacceptable by the inspection system is judged, and the warning processing is performed when the dynamic threshold of each defect belongs to the threshold unacceptable by the inspection system. The reticle defect is warned in advance, so that the reticle is cleaned timely, and the reprocessing rate and the production cost are reduced.

In one embodiment, the warning module 230 is further configured to, before inspection, judge whether the defect information of the defect reaches a set static threshold.

The obtaining module 210 is further configured to obtain historical defect information of the defect reaching the static threshold when the defect information of the defect reaches the static threshold.

The data processing module 220 is further configured to calculate a measurement error range of the defect according to the historical defect information of the defect reaching the static threshold, and to calculate a threshold unacceptable by an inspection system of the defect according to the static threshold and the measurement error range.

In the embodiment, the measurement error range of the defect is calculated according to the historical defect information of the defect and then the static threshold is reasonably limited by the measurement error range to obtain the threshold unacceptable by the inspection system. The dynamic threshold of each defect is compared with the threshold unacceptable by the inspection system to realize the warning in advance.

In one embodiment, the measurement error range is ($V_{min}$, $V_{max}$), and the dynamic threshold range of each defect is ($V_t+V_{min}$, $V_t+V_{max}$), where $V_{max}$ is a mean absolute error maximum of the historical defect information of the defect reaching the static threshold, $V_{min}$ is a mean absolute error minimum of the historical defect information of the defect reaching the static threshold, and $V_t$ is the defect information of the defect.

It will be appreciated that the mean absolute error is a mean error calculated by taking an absolute value of a predicted error, and the mean absolute error may avoid the fact that the errors cancel each other out, so that the magnitude of an actual predicted error may be reflected more accurately. Furthermore, since the warning is performed when the defect information of the defect exceeds the static threshold, actual measurement data of the defect is small by default, and the dynamic threshold of the defect is the sum of the actual measurement data and an error range.

When whether the dynamic threshold of the defect belongs to the threshold unacceptable by the inspection system is judged, the threshold unacceptable by the inspection system may be the static threshold, for example, the set static threshold in the inspection system. The threshold unacceptable by the inspection system may also be the dynamic threshold, for example, the dynamic threshold range unacceptable by the inspection system, the range is obtained by limiting the static range by using the measurement error. The early-warning is realized by using the dynamic threshold range unacceptable by the inspection system and the dynamic threshold of the defect.

In one embodiment, the threshold unacceptable by the inspection system is the static threshold. In the embodiment, the static threshold of the inspection system set before inspection may be used as the threshold unacceptable by the inspection system, the dynamic threshold range of the defect is compared with the threshold unacceptable by the inspection system, and whether the dynamic threshold range of the defect is intersected with the threshold unacceptable by the inspection system is judged. If an intersection exists, the warning processing is performed. In addition, the static threshold set in the inspection system may also be limited by using the measurement error, and a numerical value is selected from a limited range according to experience or randomly to serve as the threshold unacceptable by the inspection system.

In one embodiment, the measurement error range is ($V_{min}$, $V_{max}$), and the threshold unacceptable by the inspection system is the dynamic threshold in the range of ($V_{target}-V_{max}$, $V_{target}-V_{min}$).

$V_{max}$ is a maximum value of a mean absolute error of the historical defect information of the defect reaching the static threshold, $V_{min}$ is a mean absolute error minimum of the historical defect information of the defect reaching the static threshold, and $V_{target}$ is the static threshold.

In the embodiment, the mean absolute error minimum and the mean absolute error maximum are determined from a plurality of mean absolute errors, and the set static threshold is reasonably limited according to the mean absolute error minimum and the mean absolute error maximum. The measurement error is taken into consideration, so that the defect of which an actual size may be greater than the static threshold is accurately determined, thereby realizing early-warning and reducing the reprocessing rate. Furthermore, in some other embodiments, a critical range may also be ($V_{target}-kV_{max}$, $V_{target}-kV_{min}$), where k is a coefficient that may be set based on an actual inspection need and/or human experience, and a limiting range of the static threshold may be adjusted through adjustment of the value k.

In one embodiment, the historical defect information of the defect is the defect information of the defect collected in a selected period of time, for example, the defect information of the defect collected in continuous 6 to 8 hours. Furthermore, duration corresponding to the historical defect information of the defect may further be adjusted according to using frequency of the reticle. The higher the using frequency of the reticle is, the shorter the duration corresponding to the historical defect information of the defect is.

In one embodiment, the warning module 230 is further configured to, when inspecting that the defect information of the defect reaches the static threshold, notify a worker to perform the cleaning and/or maintenance processing on the reticle.

In conclusion, the embodiments of the present application provide a reticle defect inspection method and system. The method includes: a reticle is provided; a reticle defect inspection system is provided, and when the reticle is placed on a station or leaves the station, defect inspection is continuously performed on the reticle to obtain defect information of each defect; a dynamic threshold of each defect is obtained from the historical defect information of each defect; and whether the dynamic threshold of each defect belongs to a threshold unacceptable by the inspection system is judged, and if so, warning processing is performed. In the present application, the dynamic threshold of each defect is obtained according to the inspected defect information of each defect, whether the dynamic threshold range of each defect belongs to the threshold unacceptable by the inspection system is judged, and the warning processing is performed when the dynamic threshold of each defect belongs to the threshold unacceptable by the inspection system. Early-warning on the reticle defect is realized in advance, so that the reticle may be cleaned timely, and the reprocessing rate and the production cost are reduced.

The description of reference terms (for example, "some embodiments", "other embodiments", "ideal embodiment", and the like) in the description of the specification is intended that a specific feature, structure, material, or feature described in combination with the embodiments or examples is included in at least one embodiment or example of the present application. In the specification, the schematic description on the above terms unnecessarily refers to the same embodiment or example.

The technical features of the above embodiments may be combined freely. In order to describe briefly, the description is not made on all possible combinations of the technical features of the embodiments. However, the combinations of these technical features should be considered as a scope of the specification as long as there is no contradiction.

What is claimed is:

1. A reticle defect inspection method, comprising:
    providing a reticle;
    providing a reticle defect inspection system, and in a case where the reticle is placed on a station or leaves the station, continuously performing defect inspection on the reticle to obtain defect information of each defect;
    obtaining a dynamic threshold of each defect from the defect information of each defect;
    judging whether the dynamic threshold of each defect belongs to a threshold unacceptable by the reticle defect inspection system, and when the dynamic threshold of one or more defects belongs to a threshold unacceptable by the reticle defect inspection system, performing warning processing;
    before inspection, setting a static threshold of the reticle defect inspection system, and in a case where the defect information of a defect reaches the static threshold, obtaining historical defect information of the defect;
    calculating a measurement error range of the defect according to the historical defect information of the defect; and
    calculating the threshold unacceptable by a dynamic threshold inspection system of the defect according to the static threshold and the measurement error range.

2. The reticle defect inspection method of claim 1, wherein the measurement error range is ($V_{min}$, $V_{max}$), the dynamic threshold of each defect being ($V_t+V_{min}$, $V_t+V_{max}$),
    wherein $V_{max}$ is a mean absolute error maximum of the historical defect information of the defect reaching the static threshold, $V_{min}$ is a mean absolute error minimum of the historical defect information of the defect reaching the static threshold, and $V_t$ is the defect information of the defect.

3. The reticle defect inspection method of claim 2, wherein the threshold unacceptable by the reticle defect inspection system is the static threshold.

4. The reticle defect inspection method of claim 2, wherein the threshold unacceptable by the reticle defect inspection system is the dynamic threshold in a range of ($V_{target}-V_{max}$, $V_{target}-V_{min}$),
    wherein $V_{target}$ is the static threshold.

5. The reticle defect inspection method of claim 1, wherein the historical defect information of the defect is the defect information of the defect collected in a selected period of time.

6. The reticle defect inspection method of claim 5, wherein the historical defect information of the defect is data inspected in a case where cleaning and maintenance processing are not performed.

7. The reticle defect inspection method of claim 1, wherein the defect information of the defect comprises coordinate information and size of the defect.

8. The reticle defect inspection method of claim 1, further comprising:
    sending the defect information of the defect to a data platform for storage.

9. The reticle defect inspection method of claim 1, wherein performing warning processing comprises:
    sending warning information in the form of an e-mail, a short message or a warning management system notice.

10. The reticle defect inspection method of claim 1, further comprising:

in response to identifying that the defect information of the defect reaches the static threshold, notifying a worker to perform cleaning and maintenance processing on the reticle.

11. A reticle defect inspection system, comprising:

an acquirer, configured to, in a case where a reticle is placed on a station or leaves the station, continuously perform defect inspection on the reticle to obtain defect information of each defect;

a data processor, electrically connected with the acquirer and configured to obtain a dynamic threshold of each defect from the defect information of each defect; and a warner, electrically connected with the data processor and configured to judge whether the dynamic threshold of each defect belongs to a threshold unacceptable by the reticle defect inspection system, and to perform warning processing in response to judging that the dynamic threshold of one or more defects belongs to the threshold unacceptable by the reticle defect inspection system;

wherein the warner is further configured to, before inspection, judge whether the defect information of a defect reaches a set static threshold;

the acquirer being further configured to obtain historical defect information of the defect reaching the set static threshold in a case where the defect information of the defect reaches the set static threshold; and the data processor being further configured to calculate a measurement error range of the defect according to the historical defect information of the defect reaching the set static threshold, and to calculate the threshold unacceptable by a dynamic threshold inspection system of the defect according to the set static threshold and the measurement error range.

12. The reticle defect inspection system of claim 11, wherein the measurement error range is $(V_{min}, V_{max})$, the dynamic threshold range of each defect being $(V_t+V_{min}, V_t+V_{max})$, wherein $V_{max}$ is a mean absolute error maximum of the historical defect information of the defect reaching the set static threshold, $V_{min}$ is a mean absolute error minimum of the historical defect information of the defect reaching the set static threshold, and $V_t$ is the defect information of the defect.

13. The reticle defect inspection system of claim 12, wherein the threshold unacceptable by the reticle defect inspection system is the set static threshold.

14. The reticle defect inspection system of claim 12, wherein the threshold unacceptable by the reticle defect inspection system is the dynamic threshold in a range of $(V_{target}-V_{max}, V_{target}-V_{min})$, wherein $V_{target}$ is the set static threshold.

15. The reticle defect inspection system of claim 11, wherein the historical defect information of the defect is the defect information of the defect collected in a selected period of time.

16. The reticle defect inspection system of claim 11, wherein the defect information of the defect comprises coordinate information and size of the defect.

* * * * *